(12) United States Patent
Kubo et al.

(10) Patent No.: US 7,043,162 B2
(45) Date of Patent: May 9, 2006

(54) OPTICAL TRANSMISSION SYSTEM, FEC MULTIPLEXER, FEC MULTIPLEXER/SEPARATOR, AND ERROR CORRECTION METHOD

(75) Inventors: Kazuo Kubo, Tokyo (JP); Hideo Yoshida, Tokyo (JP); Hiroshi Ichibangase, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1002 days.

(21) Appl. No.: 10/031,235

(22) PCT Filed: May 16, 2001

(86) PCT No.: PCT/JP01/04078

§ 371 (c)(1),
(2), (4) Date: Jan. 17, 2002

(87) PCT Pub. No.: WO01/89134

PCT Pub. Date: Nov. 22, 2001

(65) Prior Publication Data

US 2002/0122221 A1      Sep. 5, 2002

(30) Foreign Application Priority Data

May 18, 2000    (JP) .............................. 2000-146973

(51) Int. Cl.
*H04B 10/00*    (2006.01)
(52) U.S. Cl. .................. 398/140; 714/755; 714/746
(58) Field of Classification Search ................. 398/140, 398/158–159; 714/746–755
See application file for complete search history.

(56) References Cited

U.S. PATENT DOCUMENTS 5,392,299 A    2/1995   Rhines et al.
5,432,800 A    7/1995   Kuroda et al.

FOREIGN PATENT DOCUMENTS

| EP | 0 949 780 A2 | 10/1999 |
| GB | 2 275 393 A | 8/1994 |
| JP | 5-122197 A | 5/1993 |

(Continued)

OTHER PUBLICATIONS

Tezuka et al., NEC, A Forward Error Correction LSI for Trunkline Optical Transmission Systems, p. 447 w/ English Translation (1998).

(Continued)

*Primary Examiner*—Agustin Bello
(74) *Attorney, Agent, or Firm*—Birch, Stewart, Kolasch & Birch, LLP (57) ABSTRACT

An FEC multiplexing circuit (2) has a configuration in which a first memory circuit (15) is arranged on the input stage of a first RS encoding circuit (16), a second memory circuit (17) is arranged on the input stage of a second RS encoding circuit (18), error correction encoding is performed by a combination of different data having two directions, and thereafter, error correction codes are multiplexed to generate an FEC frame. On the other hand, an FEC demultiplexing circuit (6) has a configuration in which a third memory circuit (42) is arranged on the output stage of a first RS decoding circuit (41), a fourth memory circuit (44) is arranged on the output stage of a second RS decoding circuit (43), error correction is performed by a combination of different data having two directions, and, thereafter, parallel data read from the fourth memory circuit (44) are multiplexed to reproduce original information data.

7 Claims, 8 Drawing Sheets

FOREIGN PATENT DOCUMENTS

| | | |
|---|---|---|
| JP | 6-318931 A | 11/1994 |
| JP | 2000-124869 A | 4/2000 |
| JP | 2000-137651 A | 5/2000 |
| JP | 2001-136079 A | 5/2001 |
| JP | 2001-168734 A | 6/2001 |

OTHER PUBLICATIONS

ITU-T /Tellecommunication Standardization Sector of ITU, G.975, 17 pages (1996).

Sab et al., ECOC, Cocaenated Forward Eroor Correction Shcmes for Long-Haul DWDM Optical Transmission SYstems, pp. 290-291 (1999).

OPTICAL TRANSMISSION SYSTEM, FEC MULTIPLEXER, FEC MULTIPLEXER/SEPARATOR, AND ERROR CORRECTION METHOD

TECHNICAL FIELD

The present invention relates to an optical transmission system that corrects bit errors using FEC (For Error Correction) method. Particularly, this invention relates to an optical transmission system which realizes long-distance and large-capacity transmission by performing error correction using FEC method, an FEC multiplexing device that is a part of the optical transmission system, an FEC demultiplexing device, and a method of correcting error.

BACKGROUND ART

Figure 7:
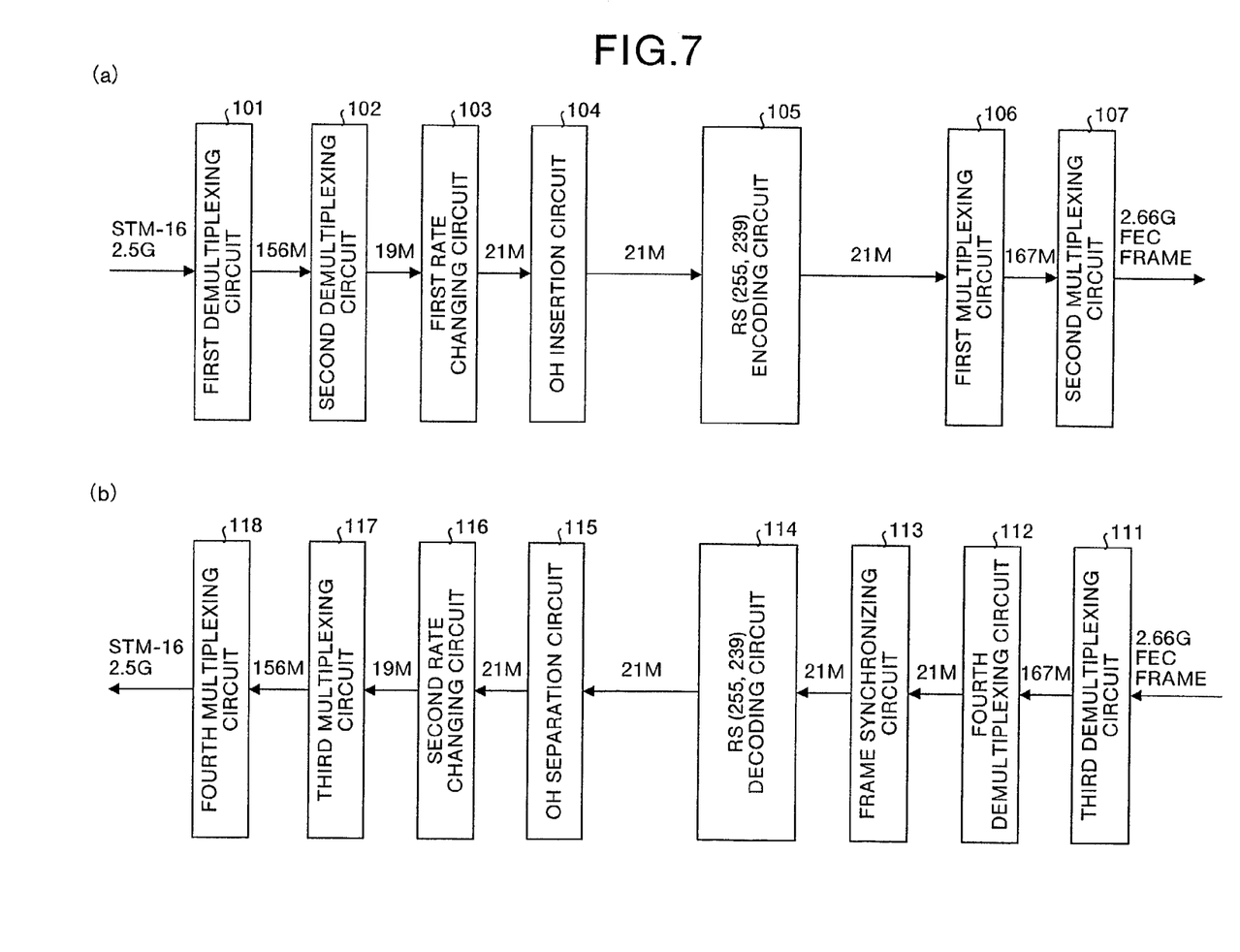

A conventional optical transmission system will be described below. As a conventional optical transmission system using FEC, a system achieved by a combination of an FEC multiplexing device and an FEC demultiplexing device described in ITU-T Recommendation G. 975 is known. FIG. 7(a) shows the configurations of the FEC multiplexing device, and FIG. 7(b) shows the configurations of the FEC demultiplexing device described in the above reference.

In FIG. 7(a), reference numeral 101 denotes a first demultiplexing circuit, reference numeral 102 denotes a second demultiplexing circuit, reference numeral 103 denotes a first rate charging circuit, reference numeral 104 denotes an OH insertion circuit, reference numeral 105 denotes an RS encoding circuit, reference numeral 106 denotes a first multiplexing circuit, and reference numeral 107 denotes a second multiplexing circuit. In FIG. 7(b), reference numeral 111 denotes a third demultiplexing circuit, reference numeral 112 denotes a fourth demultiplexing circuit, reference numeral 113 denotes a frame synchronizing circuit, reference numeral 114 denotes an RS decoding circuit, reference numeral 115 denotes an OH separation circuit, reference numeral 116 denotes a second rate change circuit 116, reference numeral 117 denotes a third multiplexing circuit, and reference numeral 118 denotes a fourth multiplexing circuit.

The operations of the FEC multiplexing device and the FEC demultiplexing device will be described below. The first demultiplexing circuit 101 which receives STM-16 data (2.5 Gbit/s) demultiplexes 16 parallel data (156 Mbit/s), and the second demultiplexing circuit 102 demultiplexes the received 16 parallel data into 128 parallel data (19 Mbit/s)

The first rate charging circuit 103 which receives the 128 parallel data adds redundant data regions to the data to generate 128 redundant parallel data (21 Mbit/s) The OH insertion circuit 104 inserts overhead information (e.g., frame synchronous information or the like) required to maintain/operate an optical transmission system into the 128 redundant parallel data. The RS (255, 239) encoding circuit 105 performs error correction encoding to an output from the OH insertion circuit 104.

The first multiplexing circuit 106 multiplexes the received data subjected to the error correction encoding into 16 parallel data (167 Mbit/s), and the second multiplexing circuit 107 generates an FEC frame (2.66 Gbit/s) from the 16 received parallel data.

On the other hand, the third demultiplexing circuit 111 of the FEC demultiplexing device which receives the FEC frame demultiplexes the frame into 16 parallel data (167 Mbit/s), and the fourth demultiplexing circuit 112 demultiplexes the 16 received parallel data into 128 parallel data (21 Mbit/s)

The frame synchronizing circuit 113 detects the start position of the FEC frame from the from synchronous information stored in the OH in the 128 received parallel data. The RS (255, 239) decoding circuit 114 detects an error of the data in the FEC frame and corrects the data into the original correct data.

The OH separation circuit 115 separates an OH from the corrected data, and the second rate change circuit 116 reduces the redundant regions to generate 128 parallel data (19 Mbit/s). The third multiplexing circuit 117 multiplexes the 128 received parallel data into 16 parallel data (156 Mbit/s), and the fourth multiplexing circuit 118 demodulates the original STM-16 data (2.5 Gbit/s) from the 16 received parallel data.

Figure 8:
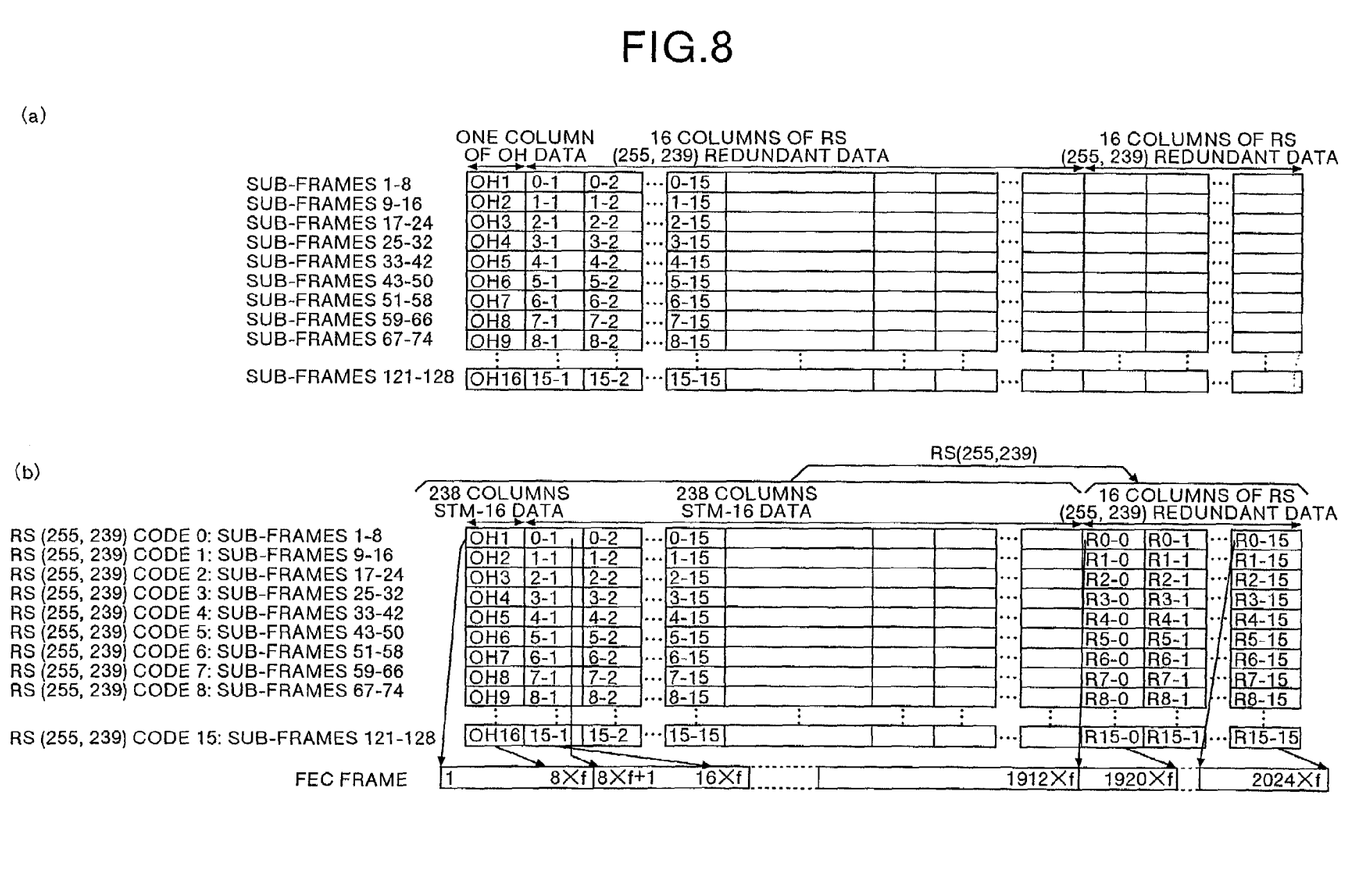

FIG. 8 includes diagrams showing the configurations of FEC frames generated by the FEC multiplexing device. The FEC frame is constituted by sub-frames 1 to 128 including one column of OH information, 238 columns of STM-16 data, and 16 columns of RS redundant data. For example, error correction encoding is performed every 8 sub-frames. More specifically, in the sub-frame 1 to 8, error correction code calculation is performed to the OH information and the STM-16 data, and RS (255, 239) redundant data are stored in R0-0 to R0-15 (see FIG. 8(a)). The FEC frame is generated by sequentially multiplexing the sub-frames 1 to 128 (see FIG. 8(b)). Reference symbol f (integer) in the FEC frame in FIG. 8(b) denotes the number of times of multiplexing of an RS code. FIG. 8(b) shows a case in which f=16 is satisfied.

In the FEC frame, since a transmission rate increases a rate which is 15/14 (255/238) the rate of the original STM-16 data, the transmission rate is 2.69 Gbit/s.

In this manner, in the conventional optical transmission system, the FEC frame is constituted as described above to make it possible to correct bit errors. As a result, high-quality service can be offered even if optical SNR decreases in the optical transmission system. In general, an RS (255, 239) code shown in FIG. 8 is changed into an RS (127, 111) code in which, for example, an error correction code length is reduced, i.e., the columns of the STM-16 data is changed from 238 to 110 (arbitrary integer equal to or smaller than 237) to increase the ratio of redundant information to information data, so that error correction capability can be more improved.

However, the conventional optical transmission system has the following problems. For example, when a distance for which transmission is to be performed is increased gradually, or when the number of wavelengths in a wavelength multiplexing system is increased gradually, so also the optical SNR deteriorates gradually. For this reason, the code length of an error correction code is reduced to maintain the error correction capability to some extent. On the other hand, when the code length of the error correction code is reduced, a ratio of redundant information to information data increases. For this reason, a transmission rate increases in accordance with the increase of the ratio. For example, when the rate of the STM-16 data is 2.5 Gbit/s, the transmission rate of an FEC frame subjected to RS (127, 111) encoding is 2.89 Gbit/s which is 127/110 times the rate of the STM-16 data.

For this reason, in the conventional optical transmission system, even though the code length of an error correction code is reduced to maintain error correction capability, an amount of deterioration of optical transmission characteristics is increased with an increase in rate, a long-distance/large-capacity optical transmission system having desired quality cannot be structured.

It is an object of the present invention to provide an optical transmission system which can improve error correction capability even though an amount of deterioration of optical transmission characteristics with an increase in rate. It is another object of this invention to provide an FEC multiplexing device constituting the optical transmission system, an FEC demultiplexing device, and a method of correcting error.

DISCLOSURE OF THE INVENTION

The optical transmission system according to one aspect of the present invention comprises an FEC generation section (corresponding to an FEC multiplexing circuit 2 according to an embodiment to be described later) which generates and outputs an FEC frame, and an error correction section (corresponding to an FEC demultiplexing circuit 6) which performs error correction based on the FEC frame. The FEC generation section includes a first reading unit (corresponding to a first memory circuit 15) which sequentially stores first parallel data generated by demultiplexing information data and, thereafter, changes the order of the storage data on the basis of a predetermined standard to read the data, a first encoding unit (corresponding to a first RS encoding circuit 16) which performs first error correction encoding to the read data to generate first error correction codes, a second reading unit (corresponding to a second memory circuit 17) which sequentially stores the first error correction codes and, thereafter, changes the order of the stored data into the original data to read the data, a second encoding unit (corresponding to a second RS encoding circuit 18) which performs second error correction encoding to the read data to generate second error correction codes, and a frame generation unit (corresponding to a first multiplexing circuit 19 and a second multiplexing circuit 20) which multiplexes the second error correction codes to generate an FEC frame. The error correction section includes a first error correction unit (corresponding to a first RS decoding circuit 41) which performs error correction by a first decoding process to second parallel data generated by demultiplexing the FEC frame, a third reading unit (corresponding to a third memory circuit 42) which sequentially stores the parallel data subjected to the first decoding process and, thereafter, changes the order of the stored data on the basis of a predetermined standard to read the data, second error correction unit (corresponding to second RS decoding circuit 43) which performs error correction by a second decoding process to the read parallel data, a fourth reading unit (corresponding to a fourth memory circuit 44) which sequentially stores the parallel data subjected to the second decoding process and, thereafter, changes the order of the stored data into the original order to read the data, and an information data reproduction unit (corresponding to a third multiplexing circuit 37 and a fourth multiplexing circuit 38) which multiplexes the read parallel data to reproduce the original information data.

In the above-mentioned optical transmission system, combinations (corresponding to error correction sections 34a, . . . , 34b) each constituted by the first error correction unit, the third reading unit, the second error correction unit, and the fourth reading unit are connected to each other in a plurality of stages.

The FEC multiplexing device according to another aspect of the present invention is provided on a transmission side of an optical transmission system. The FEC multiplexing device comprises a first reading unit which sequentially stores parallel data generated by demultiplexing information data and, thereafter, changes the order of the stored data on the basis of a predetermined standard to read the data, a first encoding unit which performs first error correction encoding to the read data to generate first error correction codes, a second reading unit which sequentially stores the first error correction codes and, thereafter, changes the order of the stored data into the original data to read the data, a second encoding unit which performs second error correction encoding to the read data to generate second error correction codes, and a frame generation unit which multiplexes the second error correction codes to generate an FEC frame.

The FEC demultiplexing device according to still another aspect of the present invention is provided on a reception side of a transmission system. The FEC demultiplexing device comprises a first error correction unit which performs error correction by a first decoding process to parallel data generated by demultiplexing an FEC frame, a first reading unit which sequentially stores the parallel data subjected to the first decoding process and, thereafter, changes the order of the stored data on the basis of a predetermined standard to read the data, a second error correction unit which performs error correction by a second decoding process to the read parallel data, a second reading unit which sequentially stores the parallel data subjected to the second decoding process and, thereafter, changes the order of the stored data into the original order to read the data, and an information data reproduction unit which multiplexes the read parallel data to reproduce the original information data.

In the above-mentioned FEC demultiplexing device, combinations each constituted by the first error correction unit, the first reading unit, the second error correction unit, and the second reading unit are connected to each other in a plurality of stages.

The error correction method according to still another aspect of the present invention comprises the FEC generation step of generating/outputting an FEC frame, and the error correction step of performing error correction by using the received FEC frame. The FEC generation step includes the first parallel data generation step of demultiplexing information data, adding an OH (OverHead) data region and first and second redundant data regions to the demultiplexed information data, and inserting predetermined OH information into the OH data region to generate first parallel data, the first reading step of sequentially storing the first parallel data and, thereafter, changes the order of the storage data on the basis of a predetermined standard to read the data, the first encoding step of performing first error correction encoding to the read data and storing the redundant information of the data in the first redundant data region to generate to generate first error correction codes, the second reading step of sequentially storing the first error correction codes and, thereafter, changes the order of the stored data into the original data to read the data, the second encoding step of performing second error correction encoding to the read data and storing the redundant information of the data in the second redundant data region to generate second error correction codes, and the frame generation step of multiplexing the second error correction codes to generate an FEC frame. The error correction step includes the second parallel data generation step of demultiplexing the FEC frame and establishing frame synchronism after the demultiplexing to generate second parallel data, the first error correction step of performing error correction by a first decoding process to the second parallel data, the third reading step of sequentially storing the parallel data subjected to the error correction and, thereafter, changes the order of the stored data on the basis of a predetermined standard to read the data, the second error correction step of performing error correction by a second decoding process to the read parallel data, the fourth reading step of sequentially storing the parallel data subjected to the error correction and, thereafter, changes the order of the stored data into the original order to read the data, and the information data reproduction step of separating the overhead information from the read parallel data, deleting the OH data regions and the redundant data regions, and multiplexing the parallel data to reproduce the original information data.

In the above-mentioned error correction method, in the error correction step, a combination of processes performed by the first error correction step, the third reading step, the second error correction step, and the fourth reading step is performed plural times.

BEST MODE FOR CARRYING OUT THE INVENTION

Embodiments of the optical transmission system according to the present invention will be described below with reference to the accompanying drawings. This invention is not limited only to the embodiments described below.

Figure 1:
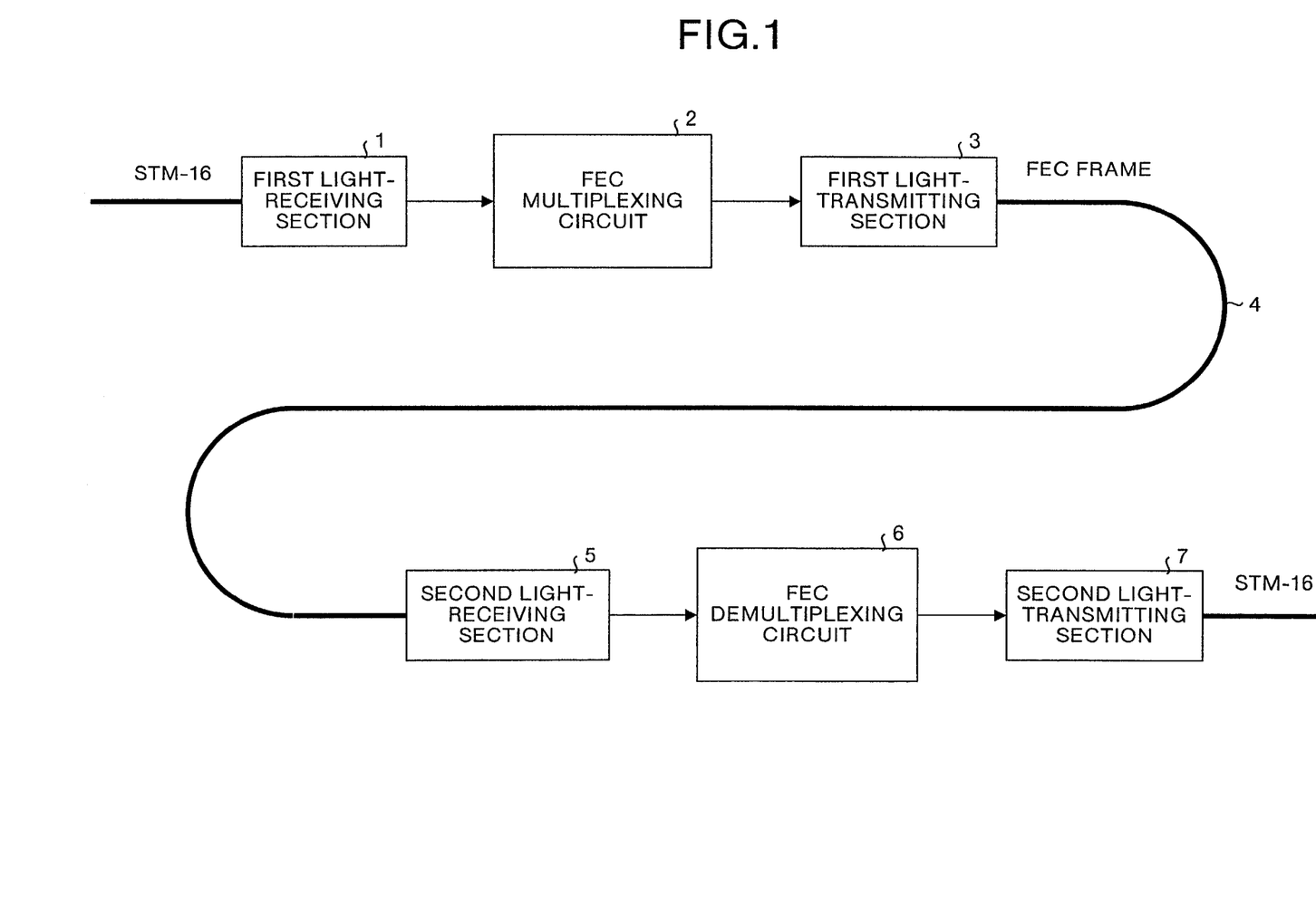
FIG. 1 is a diagram showing the configuration of an optical transmission system according to one embodiment of the present invention, FIG. 2 includes diagrams showing the configurations of an FEC multiplexing device and an FEC demultiplexing device in the optical transmission system.

First Embodiment:

FIG. 1 is a diagram showing the configuration of an optical transmission system according to the present invention. In FIG. 1, reference numeral 1 denotes a first light-receiving section, reference numeral 2 denotes an FEC multiplexing circuit, reference numeral 3 denotes a first light-transmitting section, reference numeral 4 denotes a optical transmission path, reference numeral 5 denotes a second light-receiving section, reference numeral 6 denotes an FEC demultiplexing circuit, and reference numeral 7 denotes a second light-transmitting section.

In this optical transmission system, the first light-receiving section 1 receives an STM-16 optical signal, converts the optical signal into an electric signal, and outputs the electric signal to the FEC multiplexing circuit 2. The FEC multiplexing circuit 2 demodulates the received electric signal from the first light-receiving section 1, performs processes such as insertion of OH information and FEC encoding, and performs multiplexing again to generate an FEC frame. The FEC multiplexing circuit 2 outputs the FEC frame to the first light-transmitting section 3. The first light-transmitting section 3 converts the received FEC frame into an optical signal and transmits the optical signal to the optical transmission path 4 constituted by an optical fiber.

The second light-receiving section 5 which receives the optical signal from the optical transmission path 4 converts the optical signal into an FEC frame of an electric signal, and outputs the converted FEC frame to the FEC demultiplexing circuit 6. The FEC demultiplexing circuit 6 demultiplexes the received FEC frame, performs processes such as frame synchronism of the FEC frame, FEC decoding, and separation of an OH, performs multiplexing, and generates (demodulates) the original STM-16 electric signal. The STM-16 electric signal is output to the second light-transmitting section 7. The second light-transmitting section 7 converts the received electric signal into an optical signal, and outputs the STM-16 optical signal.

In the optical transmission path 4, since an optical SNR is deteriorated due to long-distance and large-capacity transmission of an optical signal, a large number of bit errors are generated in the FEC frame converted into the electric signal by the second light-receiving section 5, and the bit errors are corrected by the FEC demultiplexing circuit 6. In this manner, a bit error rate of the STM-16 optical signal converted into the optical signal by the second light-transmitting section 7 can be improved, and communication service having predetermined quality can be provided.

Figure 2:
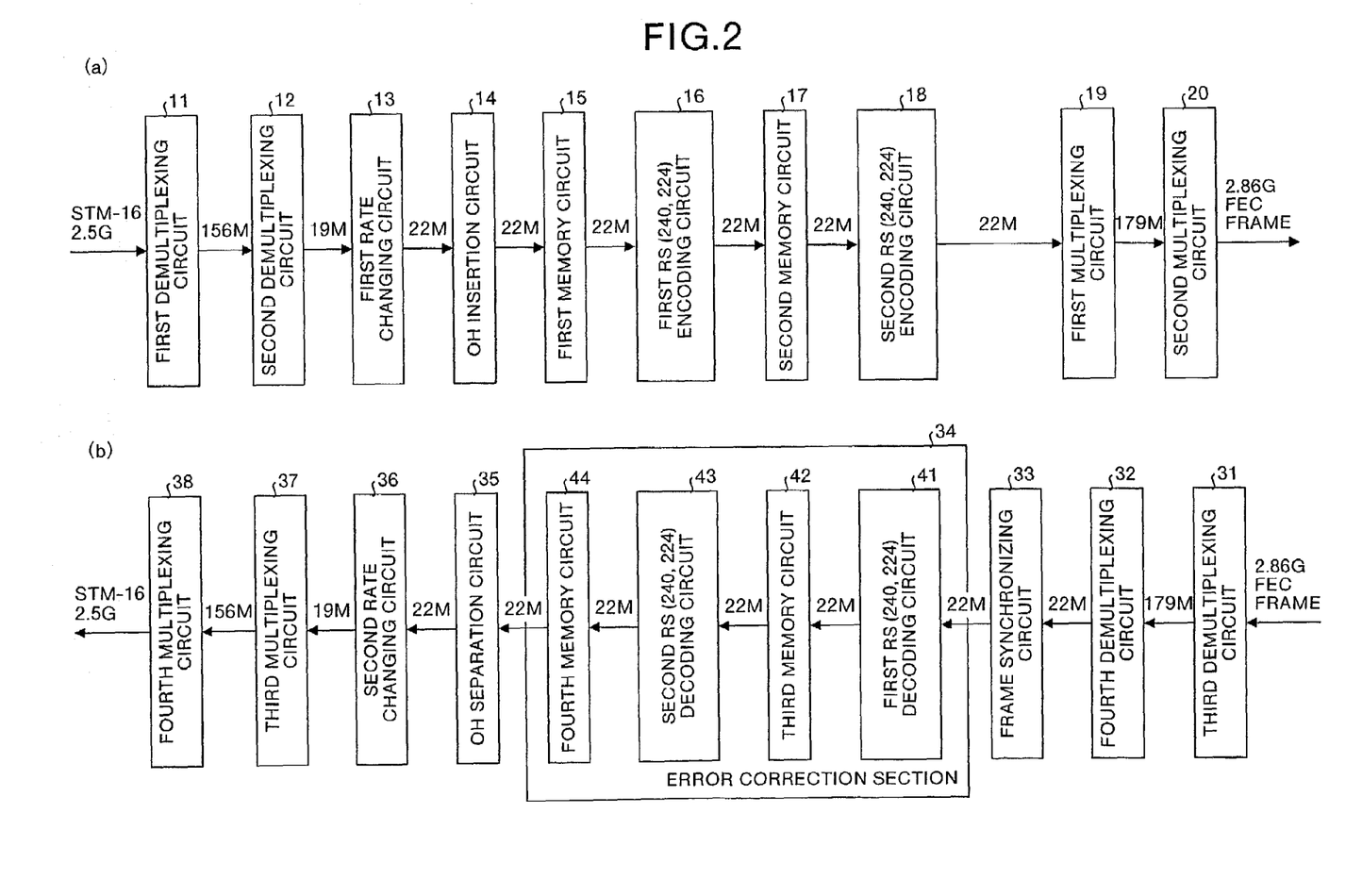

FIG. 2 includes diagrams showing the configurations of the FEC multiplexing circuit 2 (see FIG. 2(a)) and the FEC demultiplexing circuit 6 (see FIG. 2(b)) in the optical transmission system. In FIG. 2(a), reference numeral 11 denotes a first demultiplexing circuit 11, reference numeral 12 denotes a second demultiplexing circuit, reference numeral 13 denotes a first rate change circuit, reference numeral 14 denotes a OH insertion circuit, reference numeral 15 denotes a first memory circuit, reference numeral 16 denotes a first RS encoding circuit, reference numeral 17 denotes a second memory circuit, reference numeral 18 denotes a second RS encoding circuit, reference numeral 19 denotes a first multiplexing circuit, and reference numeral 20 denotes a second multiplexing circuit. In FIG. 2(b), reference numeral 31 denotes a demultiplexing circuit, reference numeral 32 denotes a fourth demultiplexing circuit, reference numeral 33 denotes a frame synchronizing circuit, reference numeral 34 denotes an error correction section, reference numeral 35 denotes an OH separation circuit, reference numeral 36 denotes a second rate change circuit, reference numeral 37 denotes a third multiplexing circuit, reference numeral 38 denotes a fourth multiplexing circuit, reference numeral 41 denotes a first RS (240, 224) decoding circuit, reference numeral 42 denotes a third memory circuit, reference numeral 43 denotes a second RS (240, 224) decoding circuit, reference numeral 44 denotes a fourth memory circuit.

The operations of the FEC multiplexing circuit 2 and the FEC demultiplexing circuit 6 according to the present invention will be described below with reference to the accompanying drawings. In the FEC multiplexing circuit 2 shown in FIG. 1, the first demultiplexing circuit 11 demodulates STM-16 data (2.5 Gbit/s) received from the first light-receiving section 1 to generate 16 parallel data (156 Mbit/s), and outputs the 16 generated parallel data to the second demultiplexing circuit 12. The second demultiplexing circuit 12 demodulates the 16 received parallel data (156 Mbit/s) into 128 parallel data (19 Mbit/s) and outputs the 128 parallel data to the first rate change circuit 13.

The first rate change circuit 13 adds OH data regions and redundant data regions to the 128 received parallel data (19 Mbit/s) to generate 128 parallel data (22 Mbit/s), and output the 128 parallel data to the OH insertion circuit 14. The OH insertion circuit 14 inserts overhead information (e.g., frame synchronous information or the like) required to maintain/operate the optical transmission system into the OH data regions in the 128 received parallel data.

The first memory circuit 15 changes the order of the 128 parallel data (22 Mbit/s) into which the pieces of overhead information are inserted to read the 128 parallel data, and outputs the 128 parallel data the order of which is changed to the first RS (240, 224) encoding circuit 16. The first RS (240, 224) encoding circuit 16 performs RS (240, 224) error correction encoding to the 128 received parallel data the order of which is changed, stores the pieces of redundant information of the 128 parallel data in the redundant data regions, and outputs the 128 encoded parallel data to the second memory circuit 17.

The second memory circuit 17 changes the order of the 128 parallel data (22 Mbit/s) rearranged by the first memory circuit 15 into the original order again to read the 128 parallel data, and outputs the parallel data to the second RS (240, 224) encoding circuit 18. The second RS (240, 224) encoding circuit 18 performs RS (240, 224) error correction encoding to the 128 parallel data the data of which is changed into the original order, stores the redundant information of the 128 parallel data in the redundant data regions, and outputs the 128 encoded parallel data to the first multiplexing circuit 19.

The first multiplexing circuit 19 multiplexes the 128 received parallel data (22 Mbit/s) to generate 16 parallel data, and outputs the 16 parallel data to the second multiplexing circuit 20. The second multiplexing circuit 20 further multiplexes the 16 received parallel data to generate/output 2.86-Gbit/s FEC frame.

On the other hand, in the FEC demultiplexing circuit 6 shown in FIG. 1, the demultiplexing circuit 31 which receives the FEC frame through the optical transmission path 4 demultiplexes the FEC frame to generate 16 parallel data (179 Mbit/s), and outputs the 16 parallel data to the fourth demultiplexing circuit 32. The fourth demultiplexing circuit 32 further demultiplexes the 16 received parallel data to generate 128 parallel data (22 Mbit/s), and outputs the 128 parallel data to the frame synchronizing circuit 33.

The frame synchronizing circuit 33 inspects frame synchronous patterns stored in the OH data regions in the 128 received parallel data to detect the start position of the FEC frame, and establishes multi-frame synchronism.

The first RS (240, 224) decoding circuit 41 performs a decoding process by RS (240, 224) codes to the 128 parallel data after the frame synchronism is established, corrects bit errors, and outputs the 128 corrected parallel data to the third memory circuit 42. The third memory circuit 42 changes the order of the 128 received parallel data (22 Mbit/s) to read the 128 parallel data, and outputs the 128 parallel data the order of which is changed to the second RS (240, 224) decoding circuit 43.

The second RS (240, 224) decoding circuit 43 performs a decoding process by RS (240, 224) codes to the 128 parallel data the order of which is changed, corrects bit errors, and outputs the 128 corrected parallel data to the fourth memory circuit 44. The fourth memory circuit 44 changes the order of the 128 parallel data (22 Mbit/s) the order of which is changed by the third memory circuit 42 to the original order to read the 128 parallel data. The 128 parallel data the order of which is changed into the original order is output to the OH separation circuit 35.

The OH separation circuit 35 separates OH from the 128 received parallel data, and outputs the 128 parallel data from which the OH are separated to the second rate change circuit 36. The second rate change circuit 36 deletes the OH data regions and the redundant data regions from the 128 received parallel data (22 Mbit/s) to generate 128 parallel data (19 Mbit/s), and outputs the 128 parallel data to the third multiplexing circuit 37. The third multiplexing circuit 37 multiplexes the 128 received parallel data (19 Mbit/s) to generate 16 parallel data (156 Mbit/s), and outputs the 16 parallel data to the fourth multiplexing circuit 38. Finally, fourth multiplexing circuit 38 further multiplexes the 16 received parallel data to generate/output 2.5-Gbit/s STM-16 data.

Figure 3:
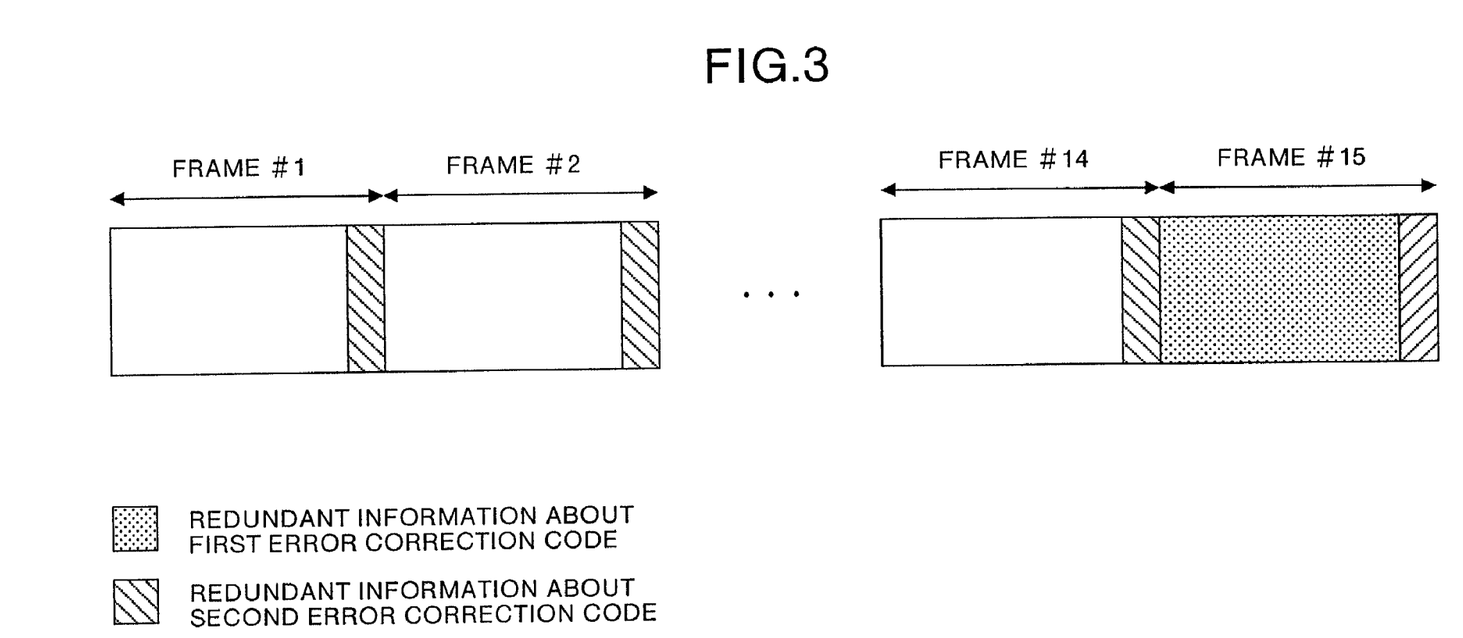
FIG. 3 is a diagram showing the concept of an FEC frame transmitted between the FEC multiplexing circuit and the FEC demultiplexing circuit.

FIG. 3 is a diagram showing the concept of an FEC frame transmitted between the FEC multiplexing circuit 2 and the FEC demultiplexing circuit 6. The FEC frame employs the multi-frame configuration which is changed from a frame #1 to a frame #15. In this case, the first RS encoding circuit 16 and the second RS decoding circuit 43 performs the processes of the frame #1 to the frame #15 by the first error correction codes, and stores redundant data in these processes in the frame #15. The second RS encoding circuit 18 and the first RS decoding circuit 41 perform processes in sections of frames by second error correction codes, and store the redundant data in these processes in the ends of the frames.

Figure 4:
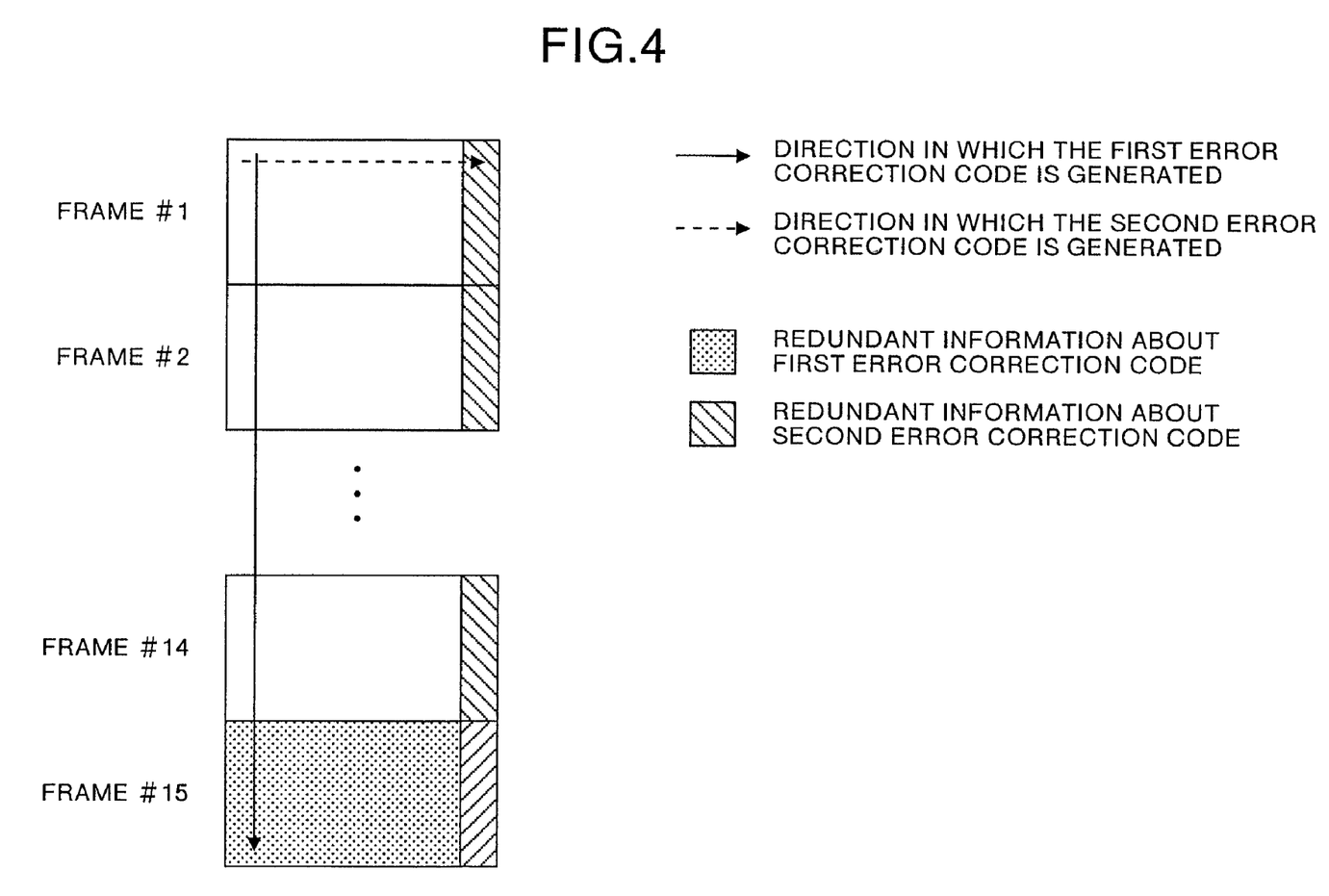
FIG. 4 is a diagram showing processing directions of a first error correction code and a second error correction code, FIG. 5 includes diagrams showing configurations of FEC frames, FIG. 6 includes diagrams showing the configurations of an FEC multiplexing circuit and an FEC demultiplexing circuit in an optical transmission system, FIG. 7 includes diagrams showing the configuration of a conventional FEC multiplexing device and a conventional FEC demultiplexing device, and FIG. 8 includes diagrams showing the configuration of FEC frames generated by the conventional FEC multiplexing device.

FIG. 4 is a diagram showing processing directions of the first error correction code and the second error correction code. In the first embodiment, as shown in FIG. 4, the processing directions of the first error correction code and the second error correction code are made different from each other. For example, burst-like bit errors are diffused to improve error correction capability.

Figure 5:
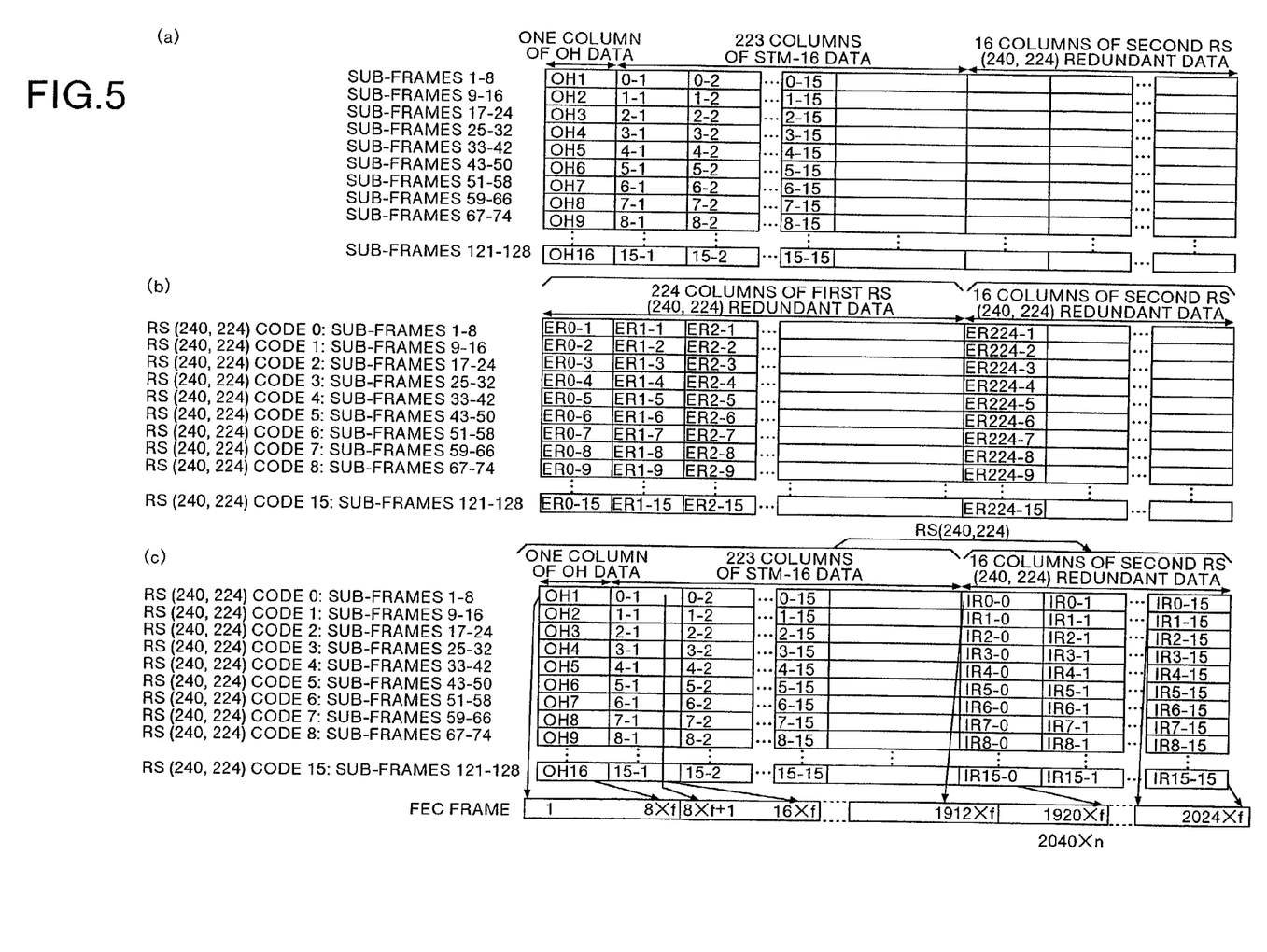

An error correction method using an FEC frame will be described below. FIG. 5(*a*) is a diagram showing the configuration of the frames (#1 to #14) of the 128 parallel data (22 Mbit/s) output from the OH insertion circuit 14. In this case, for example, OH data: OH 1 to 16 are stored in the OH data regions added by the first rate change circuit 13, and each of the sub-frames is constituted by one column of OH data, 223 columns of STM-16 data, and 16 columns of second RS (240, 224) redundant data regions. FIG. 5(*b*) is a diagram showing the configuration of the frame #15 of the 128 parallel data (22 Mbit/s) output from the OH insertion circuit 14. This frame is constituted by the first and second RS (240,224) redundant data regions. FIG. 5(*c*) is a diagram showing a method of generating an FEC frame.

The first memory circuit 15 reads the 128 parallel data (22 Mbit/s) which are sequentially stored in the memory and into which OH are inserted in the order named: the first column of the frame #1, the first column of the frame #2, ..., the first column of the frame #15, the second column of the frame #1, the second column of the frame #2, ..., the second column of the frame #15, ..., the 224th column of the frame #1, the 224th column of the frame #2, ..., the 224th column of the frame #15. The first RS encoding circuit 16 performs RS encoding to the first column of the frame #1 the first column of the frame #2, ..., the first frame of the frame #15, and stores the redundant data in the first column of the frame #15. Subsequently, similarly, RS encoding is performed to the second column to the 224th column, and the redundant data are stored in the corresponding columns of the frame #15. In this manner, first RS (240, 224) codes 0 to 223 (128 parallel data output from the first RS encoding circuit 16), and the first RS (240, 224) codes 0 to 223 are sequentially stored in the second memory circuit 17.

The second memory circuit 17 reads the frame #1 to the frame #14 in the original order again, and outputs the read frames to the second RS encoding circuit 18. The second RS encoding circuit 18 performs RS encoding to the read frames #1 to #14 every 8 sub-frames by using OH data and STM-16 data as information data. The encoded redundant are stored in the second RS (240, 224) redundant regions, respectively, to constitute second RS codes 0 to 15. Similarly, RS encoding is performed to the frame #15 every 8 sub-frames by using the first RS (240, 224) redundant data as information data. The encoded redundant data are stored in the second RS (240, 224) redundant data regions, respectively. In this manner, second RS codes 0 to 15 (128 parallel data output from the second RS encoding circuit 18) are generated and sequentially output.

Finally, the 128 parallel data (22 Mbit/s) output from the second RS encoding circuit 18 are multiplexed by the first multiplexing circuit 19 and the second multiplexing circuit 20. The second multiplexing circuit 20 generates/outputs 2.86-Gbit/s FEC frame as the multiplexing result. Reference symbol f (natural number) in FIG. 5(c) denotes the number of times of multiplexing of the RS (240, 224) codes 0 to 15. The first embodiment shows a case in which f=16 is established. In the FEC frame in the first embodiment, a transmission rate increases to 2.86 Gbit/s which is (240, 224)×(15/14) times the transmission rate of the original STM-16 data (corresponding to the OH data region and the redundant data region).

On the other hand, the first RS (240, 224) decoding circuit 41 of the FEC demultiplexing circuit 6 which receives the FEC frame performs RS (240, 224) decoding calculation to the 128 parallel data (22 Mbit/s) every 8 sub-frames to correct bit errors in the respective codes. However, when a large number of bit errors which are too many to be corrected are generated, bit errors are left in data output from the first RS decoding circuit 41 after only the decoding calculation is performed.

Therefore, in the first embodiment, the second RS decoding circuit 43 performs RS decoding calculation to the 128 parallel data (22 Mbit/s) serving as the decoding result of the first RS decoding circuit 41 in sections of columns of the frames #1 to #15 to also correct the bit errors left in the codes. In the first RS codes 0 to 223 and the second RS codes 0 to 15 in the first embodiment, as described above, the information data between the codes are rearranged and read. For this reason, bit errors are diffused between the codes, and error correction capability can be considerably improved.

As described above, in the first embodiment, the FEC frame employs a multi-frame configuration, and error correction encoding is performed by a combination of different data having two directions. For this reason, burst bit errors can be diffused in comparison with the prior art in which error correction encoding is performed to data having one direction. Therefore, error correction capability can be considerably improved. Since the improvement in error correction capability can be realized as described above, when the transmission rate increases from 2.5 Gbit/s to 2.86 Gbit/s, an amount of deterioration of optical transmission characteristics can be made smaller than that of the prior art. Therefore, a long-distance and large-capacity optical transmission system can be structured.

In the first embodiment, the first memory circuit 15 is arranged on the input stage of the first RS (240, 224) encoding circuit 16, and the second memory circuit 17 is arranged on the input stage of the second RS (240, 224) encoding circuit 18, so that the FEC frame can be transmitted without changing the order of the STM-16 data.

The first embodiment describes that RS (240,224) codes are used as the first error correction codes, and the RS (240, 224) codes are used as the second error correction codes. However, the configuration is not limited to the first embodiment. For example, the code length of the former RS code may be represented by p1, an information data length may be represented by q1, the code length of the later RS code may be represented by p2, and an information data length may be represented by q2. In addition, the number of times of multiplexing may be represented by f, the number of multi-frames is represented by mf, the first error code and the second error code may be expressed by RS (p1, q1) codes and RS (p2, q2) code (p2=k1 (integer)×mf, q2=k2 (integer)×f, k1).

The first embodiment describes that OH of 1 bit is set for each sub-frame. However, for example, OH of 2 or more bits may be set for each sub-frame.

Figure 6:
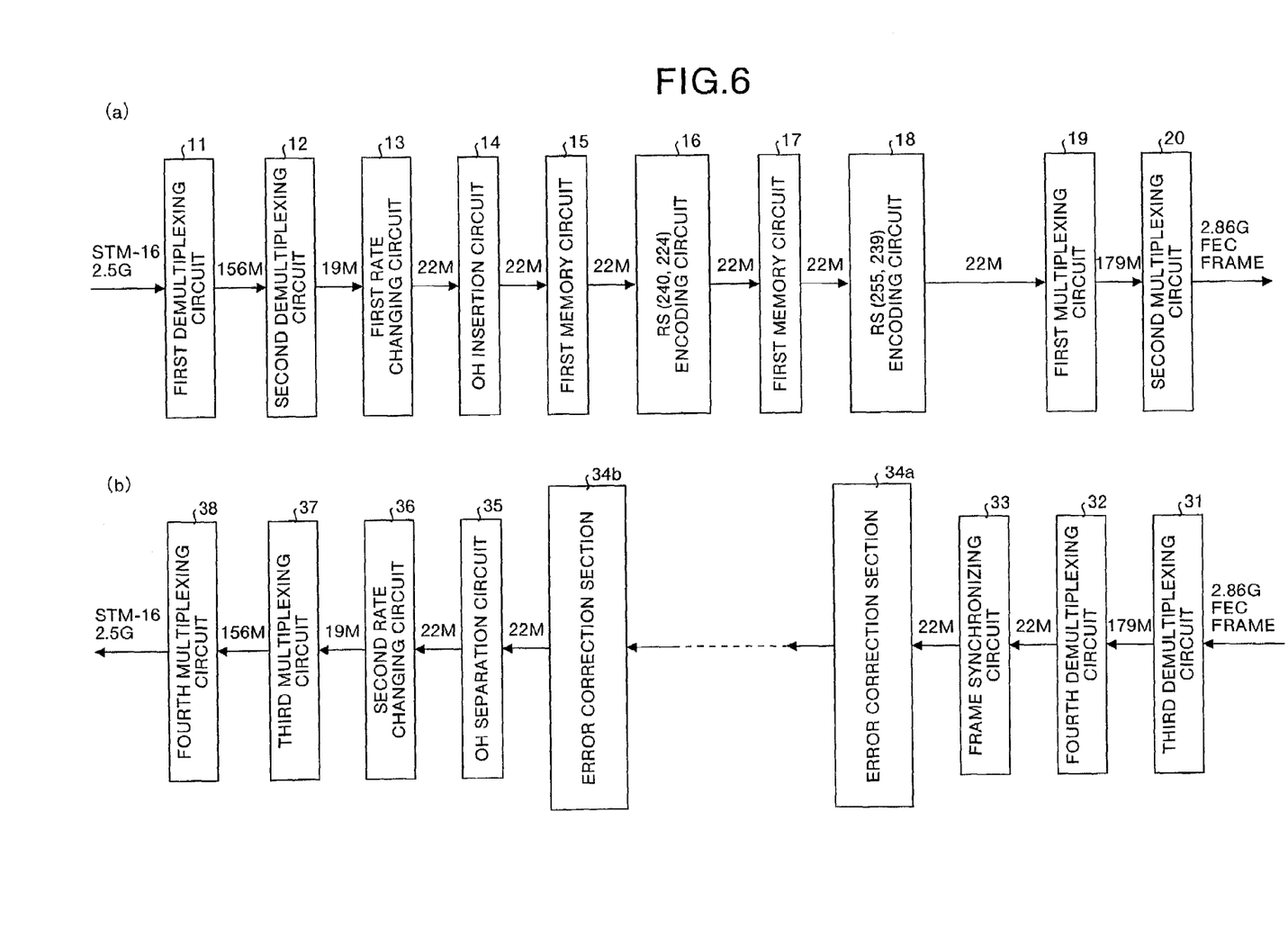

Second Embodiment:

FIG. 6 includes diagrams showing the configurations of an FEC multiplexing circuit 2 (see FIG. 6(a)) and an FEC demultiplexing circuit (see FIG. 6(b)) in the optical transmission system (see FIG. 1) described above as a second embodiment. In FIG. 6, each reference numeral 34a, 34b denotes an error correction section. In the second embodiment, a plurality of error correction sections 34 each arranged in the FEC demultiplexing circuit 6 are arranged one after the other. The same reference numerals as in the first embodiment described above denote the same parts in second embodiment, and a description thereof will be omitted.

In the second embodiment, the process performed by the error correction section is repeated plural times. As a result, error correction capability can be considerably improved in comparison with the first embodiment. In the second embodiment, a long-distance/large-capacity optical transmission system can be easily structured without changing the configuration of the FEC frame and without changing the hardware configuration except that a plurality of the error correction sections are connected to each other one after the other.

Even in the second embodiment, in the same manner as in first embodiment, the first error correction code and the second error correction code can be expressed as an RS (p1, q1) code and an RS (p2, q2) code (p2=k1 (integer)×mf, q2=k2 (integer)×f, k1). As in first embodiment, OH having 2 or more bits may be set for each sub-frame.

As described above, according to the present invention, an FEC frame employs a multi-frame configuration, and error correction encoding is performed by a combination of different data having two directions. For this reason, burst bit errors can be diffused in comparison with the prior art in which error correction encoding is performed to data having one direction, and an optical transmission system which can considerably improve error correction capability can be advantageously obtained. In addition, since the improvement in error correction capability can be realized, even though the transmission rate increases, an amount of deterioration of optical transmission characteristics can be made smaller than that of the prior art, and an optical transmission system which can realize long-distance transmission and large-capacity transmission can be advantageously obtained. The first reading unit is arranged on the input stage of the first encoding unit, and the second reading unit is arranged on the input stage of the second encoding unit, so that an optical transmission system which can transmit an FEC frame without changing the order of information data can be advantageously obtained.

According to the next invention, since the processes performed by the first error correction unit, the third reading unit, the second error correction unit, and the fourth reading unit are repeated plural times, an optical transmission system which can further considerably improve error correction capability can be advantageously obtained. In addition, a long-distance/large-capacity optical transmission system, which can be easily structured without changing the configuration of the FEC frame and without changing the hardware configuration except that a plurality of the error correction sections are connected to each other one after the other, can be advantageously obtained.

According to the next invention, the FEC frame employs a multi-frame configuration, and error correction encoding is performed by a combination of different data having two directions. For this reason, burst bit errors can be diffused in comparison with the prior art in which error correction encoding is performed to data having one direction, and an FEC multiplexing device which can considerably improve error correction capability can be advantageously obtained. In addition, the first reading unit is arranged on the input stage of the first encoding unit, and the second reading unit is arranged on the input stage of the second encoding unit, so that an FEC multiplexing device which can transmit an FEC frame without changing the order of information data can be advantageously obtained.

According to the next invention, the FEC frame employs a multi-frame configuration, and error correction is performed by a combination of different data having two directions. For this reason, an FEC demultiplexing device which can considerably improve error correction capability in comparison with the prior art in which error correction is performed to data having one direction can be advantageously obtained. In addition, since the improvement in error correction capability can be realized, even though the transmission rate increases, an amount of deterioration of optical transmission characteristics can be made smaller than that of the prior art, and an FEC demultiplexing device which can structure a long-distance and large-capacity optical transmission system can be advantageously obtained.

According to the next invention, since the processes performed by the first error correction unit, the first reading unit, the second error correction unit, and the second reading unit are repeated plural times, an FEC demultiplexing device which can further considerably improve error correction capability can be advantageously obtained. In addition, an FEC demultiplexing device, which can easily structure a long-distance/large-capacity optical transmission system without changing the configuration of the FEC frame and without changing the hardware configuration except that the respective units are connected to each other one after the other, can be advantageously obtained.

According to the next invention, the FEC frame employs a multi-frame configuration, and error correction encoding is performed by a combination of different data having two directions. For this reason, burst bit errors can be diffused in comparison with the prior art in which error correction encoding is performed to data having one direction, and an error correction method which can considerably improve error correction capability can be advantageously obtained.

According to the next invention, since the processes performed by the first error correction step, the third reading step, the second error correction step, and the fourth reading step are repeated plural times, an error correction method which can further considerably improve error correction capability can be advantageously obtained.

INDUSTRIAL APPLICABILITY

As described above, the optical transmission system, the FEC multiplexing device, the FEC demultiplexing device, and the error correction method according to the present invention are useful for an optical transmission system which corrects bit errors by FEC (Forward Error Correction), and are suitable to improve error correction capability even if an amount of deterioration of optical transmission characteristics increases by an increase in rate.

The invention claimed is:

1. An optical transmission system comprising:
an FEC generation section which generates and outputs an FEC frame; and an error correction section which performs error correction based on the FEC frame,
wherein the FEC generation section includes,
   a first reading unit which sequentially stores first parallel data generated by demultiplexing information data and, thereafter, changes the order of the storage data on the basis of a predetermined standard to read the data;
   a first encoding unit which performs first error correction encoding to the read data to generate first error correction codes;
   a second reading unit which sequentially stores the first error correction codes and, thereafter, changes the order of the stored data into the original data to read the data;
   a second encoding unit which performs second error correction encoding to the read data to generate second error correction codes; and
   a frame generation unit which multiplexes the second error correction codes to generate the FEC frame, and
wherein the error correction section includes,
   a first error correction unit which performs error correction by a first decoding process to second parallel data generated by demultiplexing the FEC frame;
   a third reading unit which sequentially stores the parallel data subjected to the first decoding process and, thereafter, changes the order of the stored data on the basis of a predetermined standard to read the data;
   a second error correction unit which performs error correction by a second decoding process to the read parallel data;
   a fourth reading unit which sequentially stores the parallel data subjected to the second decoding process and, thereafter, changes the order of the stored data into the original order to read the data; and
   an information data reproduction unit which multiplexes the read parallel data to reproduce the original information data.

2. The optical transmission system according to claim 1, wherein combinations each constituted by the first error correction unit, the third reading unit, the second error correction unit, and the fourth reading unit are connected to each other in a plurality of stages.

3. An FEC multiplexing device provided on a transmission side of an optical transmission system, the FEC multiplexing device comprising:
- a first reading unit which sequentially stores parallel data generated by demultiplexing information data and, thereafter, changes the order of the stored data on the basis of a predetermined standard to read the data;
- a first encoding unit which performs first error correction encoding to the read data to generate first error correction codes;
- a second reading unit which sequentially stores the first error correction codes and, thereafter, changes the order of the stored data into the original data to read the data;
- a second encoding unit which performs second error correction encoding to the read data to generate second error correction codes; and
- a frame generation unit which multiplexes the second error correction codes to generate an FEC frame.

4. An FEC demultiplexing device provided on a reception side of a transmission system, the FEC demultiplexing device comprising:
- a first error correction unit which performs error correction by a first decoding process to parallel data generated by demultiplexing an FEC frame;
- a first reading unit which sequentially stores the parallel data subjected to the first decoding process and, thereafter, changes the order of the stored data on the basis of a predetermined standard to read the data;
- a second error correction unit which performs error correction by a second decoding process to the read parallel data;
- a second reading unit which sequentially stores the parallel data subjected to the second decoding process and, thereafter, changes the order of the stored data into the original order to read the data; and
- an information data reproduction unit which multiplexes the read parallel data to reproduce the original information data.

5. The FEC demultiplexing device according to claim 4, wherein combinations each constituted by the first error correction unit, the first reading unit, the second error correction unit, and the second reading unit are connected to each other in a plurality of stages.

6. An error correction method comprising:
the FEC generation step of generating and outputting an FEC frame; and the error correction step of performing error correction based on the FEC frame,
wherein the FEC generation step includes,
- the first parallel data generation step of demultiplexing information data, adding an OH (OverHead) data region and first and second redundant data regions to the demultiplexed information data, and inserting predetermined OH information into the OH data region to generate first parallel data;
- the first reading step of sequentially storing the first parallel data and, thereafter, changes the order of the storage data on the basis of a predetermined standard to read the data;
- the first encoding step of performing first error correction encoding to the read data and storing the redundant information of the data in the first redundant data region to generate to generate first error correction codes;
- the second reading step of sequentially storing the first error correction codes and, thereafter, changes the order of the stored data into the original data to read the data;
- the second encoding step of performing second error correction encoding to the read data and storing the redundant information of the data in the second redundant data region to generate second error correction codes; and
- the frame generation step of multiplexing the second error correction codes to generate an FEC frame, and
wherein the error correction step includes,
- the second parallel data generation step of demultiplexing the FEC frame and establishing frame synchronism after the demultiplexing to generate second parallel data;
- the first error correction step of performing error correction by a first decoding process to the second parallel data;
- the third reading step of sequentially storing the parallel data subjected to the error correction and, thereafter, changes the order of the stored data on the basis of a predetermined standard to read the data;
- the second error correction step of performing error correction by a second decoding process to the read parallel data; and
- the fourth reading step of sequentially storing the parallel data subjected to the error correction and, thereafter, changes the order of the stored data into the original order to read the data; and
- the information data reproduction step of separating the overhead information from the read parallel data, deleting the OH data regions and the redundant data regions, and multiplexing the parallel data to reproduce the original information data.

7. The error correction method according to claim 6, wherein, in the error correction step, a combination of processes performed by the first error correction step, the third reading step, the second error correction step, and the fourth reading step is performed plural times.

* * * * *